United States Patent [19]
Narita

[11] Patent Number: 5,706,156
[45] Date of Patent: Jan. 6, 1998

[54] SEMICONDUCTOR DEVICE HAVING AN ESD PROTECTIVE CIRCUITRY

[75] Inventor: Kaoru Narita, Tokyo, Japan

[73] Assignee: NEC Corporation, Tokyo, Japan

[21] Appl. No.: 591,025

[22] Filed: Jan. 25, 1996

[30] Foreign Application Priority Data

Jan. 25, 1995 [JP] Japan ................................ 7-009375

[51] Int. Cl.$^6$ ........................................................ H02H 9/00
[52] U.S. Cl. ................................ 361/56; 361/111; 361/118
[58] Field of Search .................................. 361/56, 91, 111, 361/118, 58, 115

[56] References Cited

U.S. PATENT DOCUMENTS 5,521,783  5/1996  Wolfe et al. .............................. 361/56

FOREIGN PATENT DOCUMENTS 372666  3/1991  Japan ............................. H01L 27/04
786510  3/1995  Japan ............................. H01L 27/04

Primary Examiner—Jeffrey A. Gaffin
Assistant Examiner—Stephen Jackson
Attorney, Agent, or Firm—Whitham, Curtis, Whitham & McGinn

[57] ABSTRACT

A semiconductor device has a protective circuitry including a common discharge line, a first protective device connected between one of input/output terminals and the discharge line, and a second protective device connected between one of Vcc and ground terminals and the discharge line. The second protective device has an on-resistance as much as ½ of the on-resistance of the first protective device. Each of the power terminals and ground terminals generally has a large capacitance to accumulate a large amount of electric charge during a CDM test after charging of the semiconductor device as a whole. The low on-resistance prevents the inner circuit and input/output buffers of the semiconductor device from being applied with a higher potential during subsequent grounding of the semiconductor device in the CDM test.

18 Claims, 8 Drawing Sheets

SEMICONDUCTOR DEVICE HAVING AN ESD PROTECTIVE CIRCUITRY

BACKGROUND OF THE INVENTION

(a) Field of the Invention

The present invention relates to a semiconductor device having an ESD (electro-static discharge) protective circuitry and, more particularly, to a semiconductor device having an ESD protective circuitry, especially adapted for protecting the semiconductor device during a charged device model (CDM) test.

(b) Description of the Related Art

FIG. 1 shows a conventional semiconductor device having an ESD protective circuitry for protecting the semiconductor device against an ESD-induced failure. The semiconductor device includes an inner circuit 60 or a heart of the semiconductor device, an external terminal group including input/output terminals (pads) 32, 35, 3n and Vcc and ground terminals 31, 33, 34, 36 and 37, and input/output buffers 70 and 71, interposed between Vcc line 311 or 341 and ground line 331 or 361, for transmitting signals between respective input/output terminals 32 and 35 and the inner circuit 60.

Each of the input/output buffers 70 and 71 is implemented by an inverter including a P-channel transistor Q1 or Q3 and an N-channel transistor Q2 or Q4 connected in series. The semiconductor device further includes a clamp device Q5 disposed for each input terminal 31 or 3n to restrict the level of a corresponding input signal, and a protective circuitry including a protective device 21, 22, ..., or 2n disposed for each of the terminals 31 to 3n of the terminal group and a common discharge line 10 disposed for the protective devices for sinking electrostatic charge.

The protective devices 21 to 2n are not conductive at the usual potential level of the respective terminals 31 to 3n, but are conductive at an overvoltage of the respective terminals 31 to 3n to dissipate electrostatic charge from the terminals through the common discharge line 10. For example, if an overvoltage pulse is applied between terminal 32 and terminal 35, protective devices 22 and 25 become conductive so that a current path is formed from terminal 32 through protective device 22, common discharge line 10, protective device 25 to terminal 35 to discharge the pulse, thereby protecting the inner circuit from an ESD-induced failure.

Patent Publication No. JP-A-91-72666 describes a semiconductor device of a type similar to that described above, in which the common discharge line connected to the protective devices is implemented by a ground line disposed for the inner circuit, thereby reducing on-resistance of the protective devices and obtaining a reduced chip area.

ESD tests for testing the semiconductor device include a first type such as described above in which an overvoltage is applied between two external terminals and a second type in which the semiconductor device under test is charged as a whole up to a predetermined potential, and subsequently, one of the terminals in suddenly grounded. The latter type is generally called a CDM test. The CDM test is different from the first type as to accumulated electric charge and the discharge path therefor formed during the test procedure.

The CDM test will be described below with reference to FIG. 2 in which input terminal 32, for example, is grounded after charging of the semiconductor device of FIG. 1 as a whole. Electric charge is accumulated on the parasitic capacitances 4a, 4b and 4c of terminals 32, 33 and 35 formed between respective terminals 32, 33 and 35 and the ground after the charging. I noted that parasitic capacitance 4b of the ground terminal 33 is larger than parasitic capacitances 4a and 4c of the input/output terminals 32 and 35. Accordingly, when terminal 32 is grounded, as shown in FIG. 2, current flowing through the ground terminal 33 is extremely large as compared to the current flowing through other terminals 32 and 35, which is indicated by dotted current paths 5a and 5c compared to a solid current path 5b in the drawing. In other words, the currents flowing through current paths 5a and 5c are negligible compared to the current flowing through the current path 5b, i.e., through protective device 23 disposed for ground terminal 33.

FIG. 3 shows a substantially equivalent circuit for FIG. 2 after neglecting currents flowing through current paths 5a and 5c. If an on-resistance R of protective devices 22 and 23 is designed to have a large value, ground line 331 for the inner circuit 60 is supplied with a high potential due to high voltage drops across the protective devices 22 and 23 to thereby destroy the elements in the inner circuit 60. On the other hand, if the on-resistance R is designed to have a sufficiently low value, the chip area for the protective circuitry including protective devices 22 and 23 must be large, increasing the total chip area for the semiconductor device. In general, a low value of the on-resistance R of the protective devices sufficient to protect the inner circuit, especially during a CDM test, and a small chip area are believed to be trade-offs.

SUMMARY OF THE INVENTION

In view of the foregoing, it is an object of the present invention to provide a semiconductor device having a protective circuitry for sufficiently protecting the inner circuit, especially during a CDM test, while obtaining a reduced chip area.

In accordance with the present invention, there is provided a semiconductor device comprising a substrate, an inner circuit formed on the substrate, an external terminal group disposed for the inner circuit and including a plurality of first terminals and a plurality of second terminals, and a protective circuitry including a common discharge line, a first protective device connected between each of the first terminals and the common discharge line and a second protective device connected between each of the second terminals and the common discharge line, each of the first terminals having a first parasitic capacitance, each of the second terminals having a second parasitic capacitance larger than the first parasitic capacitance, the first protective device having a first on-resistance, the second protective device having a second on-resistance smaller than the first on-resistance.

In the semiconductor device according to the present invention, when one of the external terminals is grounded after charging of the semiconductor device as a whole in a CDM test, an effective protection can be obtained by the protective circuitry, because of a small voltage drop across each of the protective devices. This results from the fact that each of the second protective devices generates only a small voltages drop due to the small, first on-resistance thereof in spite of the large current flowing through the second protective devices, and that each of the first protective devices generates only a small voltage drop due to the small current flowing therethrough in spite of the large, first on-resistance of the first protective devices. The increase of the chip area is limited by employing the first, large on-resistance of the first protective devices, which may be large in number as compared to the number of the second protective devices.

Patent Publication No. JP-A-91-72666 as mentioned before does not note the value of the on-resistance R of the respective protective devices. It is believed from the state of the art that on-resistance R of the protective devices in this publication have the same value among all the protective devices.

The above and other objects, features and advantages of the present invention will be more apparent from the following description, referring to the accompanying drawings, in which similar elements or elements having similar functions are designated by the same reference numerals throughout the drawings.

BRIEF DESCRIPTION OF THE DRAWINGS

FIG. 7A is a circuit diagram of a first example of the protective device in FIG. 5 while

FIG. 8A is a circuit diagram of a second example of the protective device in FIG. 5 while FIG. 9A is a circuit diagram of a third example of the protective device in FIG. 5 while

DESCRIPTION OF THE PREFERRED EMBODIMENTS

Before describing details of the present invention, a semiconductor device disclosed by me in Japanese Patent Application No. 93-188802, published on Mar. 31, 1995 as Patent Publication No. JP-A-95-86510, will be first described with reference to FIG. 4, for the sake of understanding of the present invention.

Figure 1:
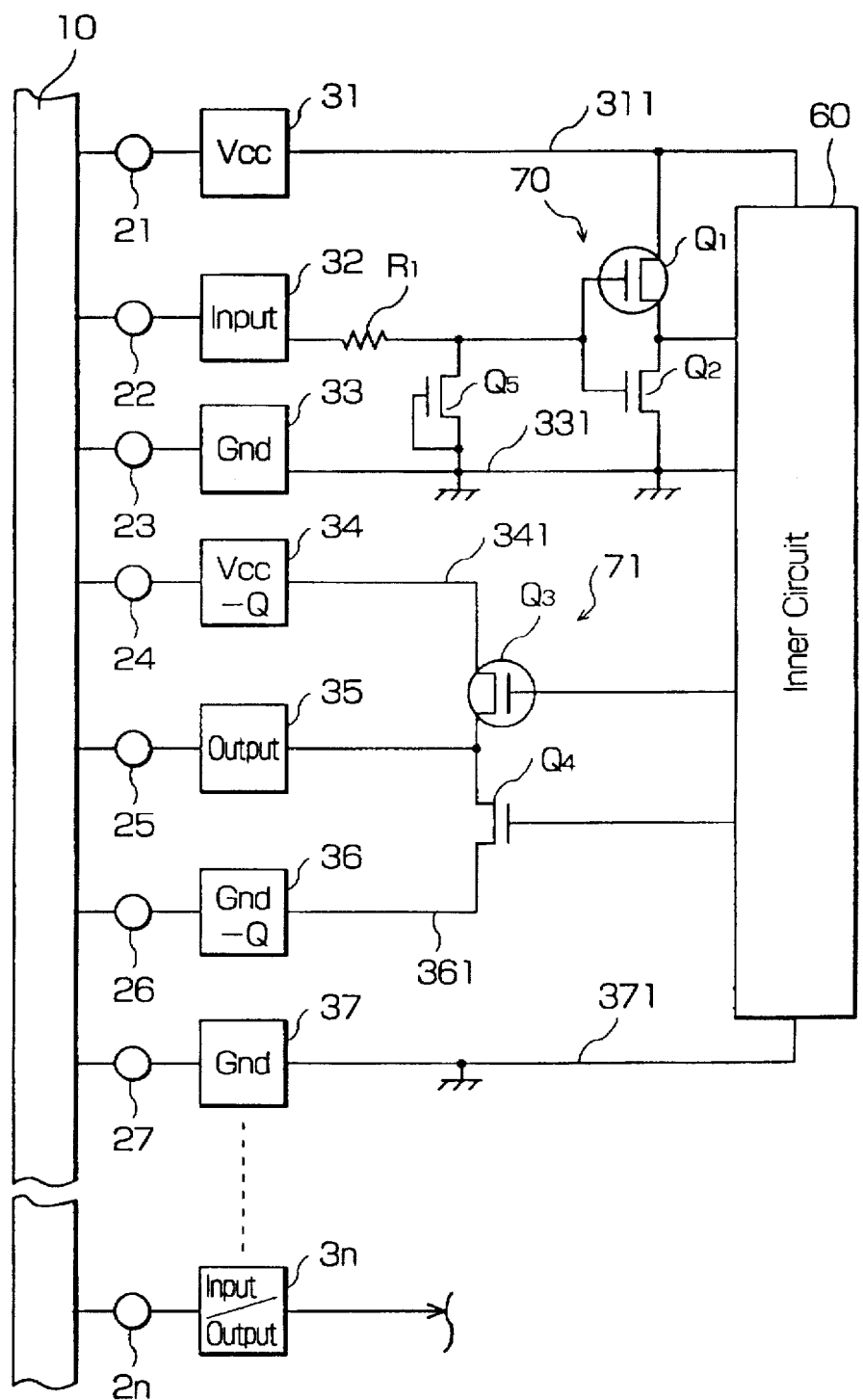
FIG. 1 is a circuit diagram of a conventional semiconductor device having protective devices for external terminals.
Figure 2:
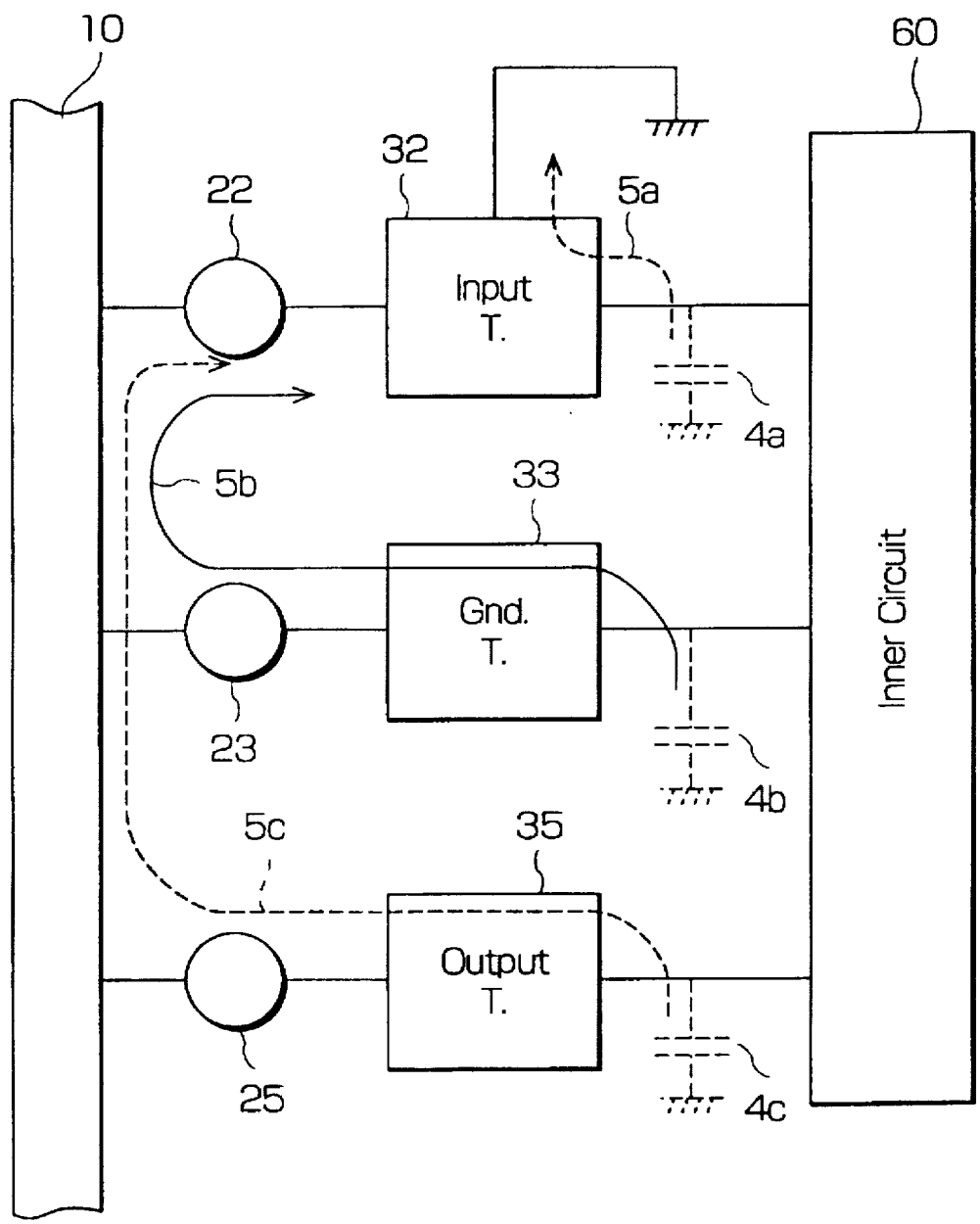
FIG. 2 is a partial circuit diagram of the circuit of FIG. 1 during a CDM test.
Figure 4:
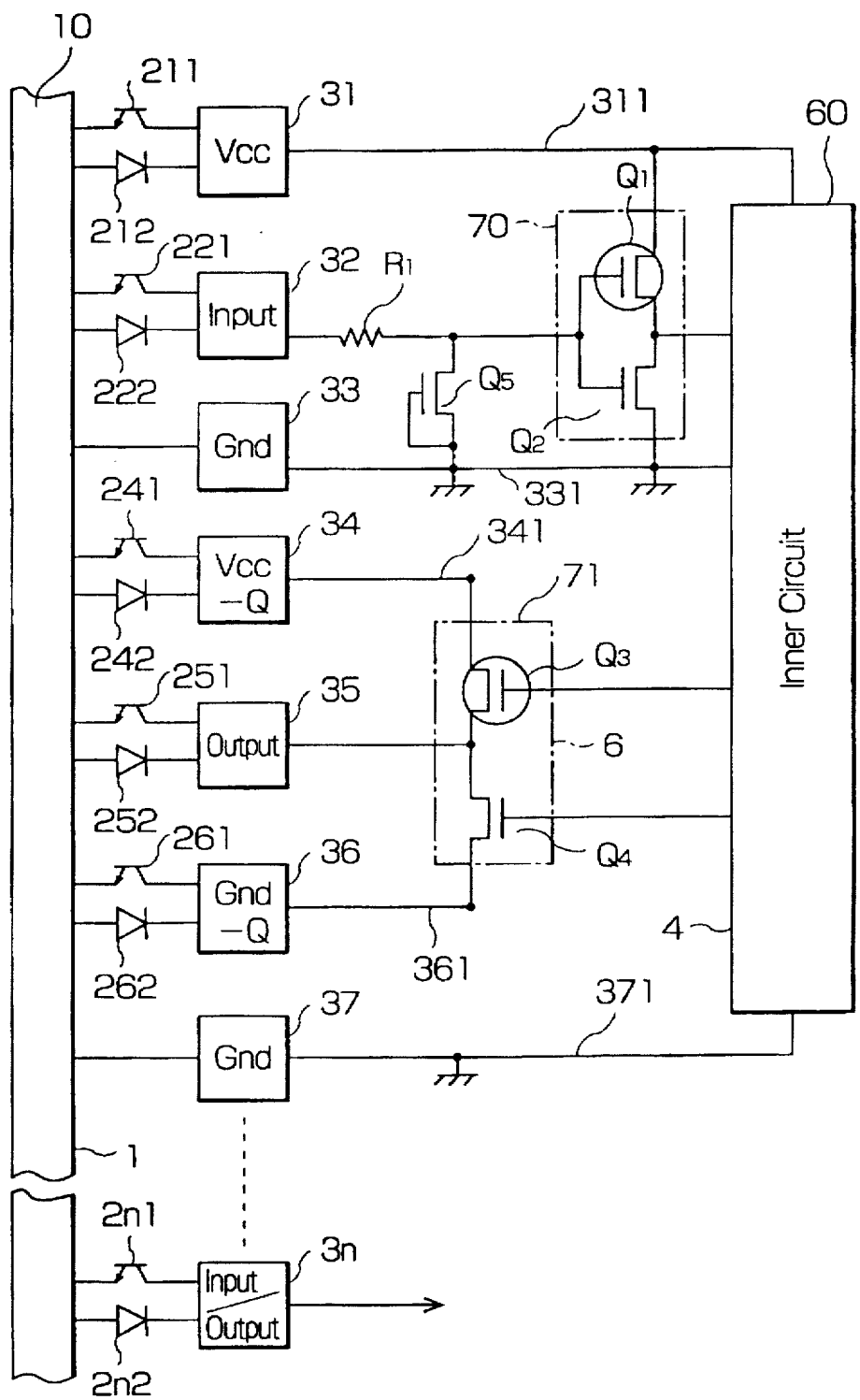
FIG. 4 is a circuit diagram of a semiconductor device proposed in an earlier application by the applicant.

FIG. 4 is different from FIG. 1 in that each of the protective devices of FIG. 4 is implemented by a combination of an NPN transistor (or clamp element) 211, 221, . . . , or 2n1 and a diode 212, 222, . . . , or 2n2, and that each of ground terminals 33 and 37 is directly coupled to the common discharge line 10. Each combination of NPN transistor and diode is coupled to common discharge line 10, with the emitter of the NPN transistor 211, 221, . . . , 2n1 and anode of the diode 212, 222, . . . , 2n2 being connected to the common discharge line 10. It is recited in the text that the discharge line 10 is implemented by a scribe line encircling the chip area of the semiconductor device.

In the semiconductor device of the earlier application, if a positive pulse is applied to one of the input/output terminals (or one of Vcc terminals), for example terminal 32, with respect to another of the input/output terminals (for example, terminal 35), the positive pulse is absorbed through a current path including NPN transistor 221, common discharge line 10 and diode 252. During the absorption of the pulse, the input for the input buffer 70 is maintained at a voltage below a predetermined voltage by the function of NPN transistor 221 acting as a clamp element. The predetermined voltage is determined by the sum of the clamp voltage by NPN transistor 221 plus forward voltage drop (built-in potential) VB of diode 252 plus a voltage drop generated across the metal lines.

If a positive pulse is applied to one of the input/output terminals (for example, terminal 32) with respect to the ground, the positive pulse is dissipated to the ground through clamp element 221, common discharge line 10 and ground lines 331 and 371 connected directly to the common discharge line 10. On the other hand, if a negative pulse is applied to input terminal 32 with respect to the ground, the negative pulse is dissipated to the ground through diode 222, common discharge line 10 and ground lines 331 and 371. In this manner, any possible pulses can be cancelled by each other or dissipated to the ground so that the inner circuit and input buffers are substantially free from an overvoltage failure.

I further studied the function of the protective circuitry in the earlier application and found that it was not necessary to provide two elements or a large width element for each of the terminals in order to obtain sufficient protective function by the protective circuitry. It is sufficient that only each of the external terminals having a large capacitance is provided with a protective device having a large width current path. The present invention is based on the finding.

Now, an embodiment of the present invention will be described with reference to the drawings.

Figure 5:
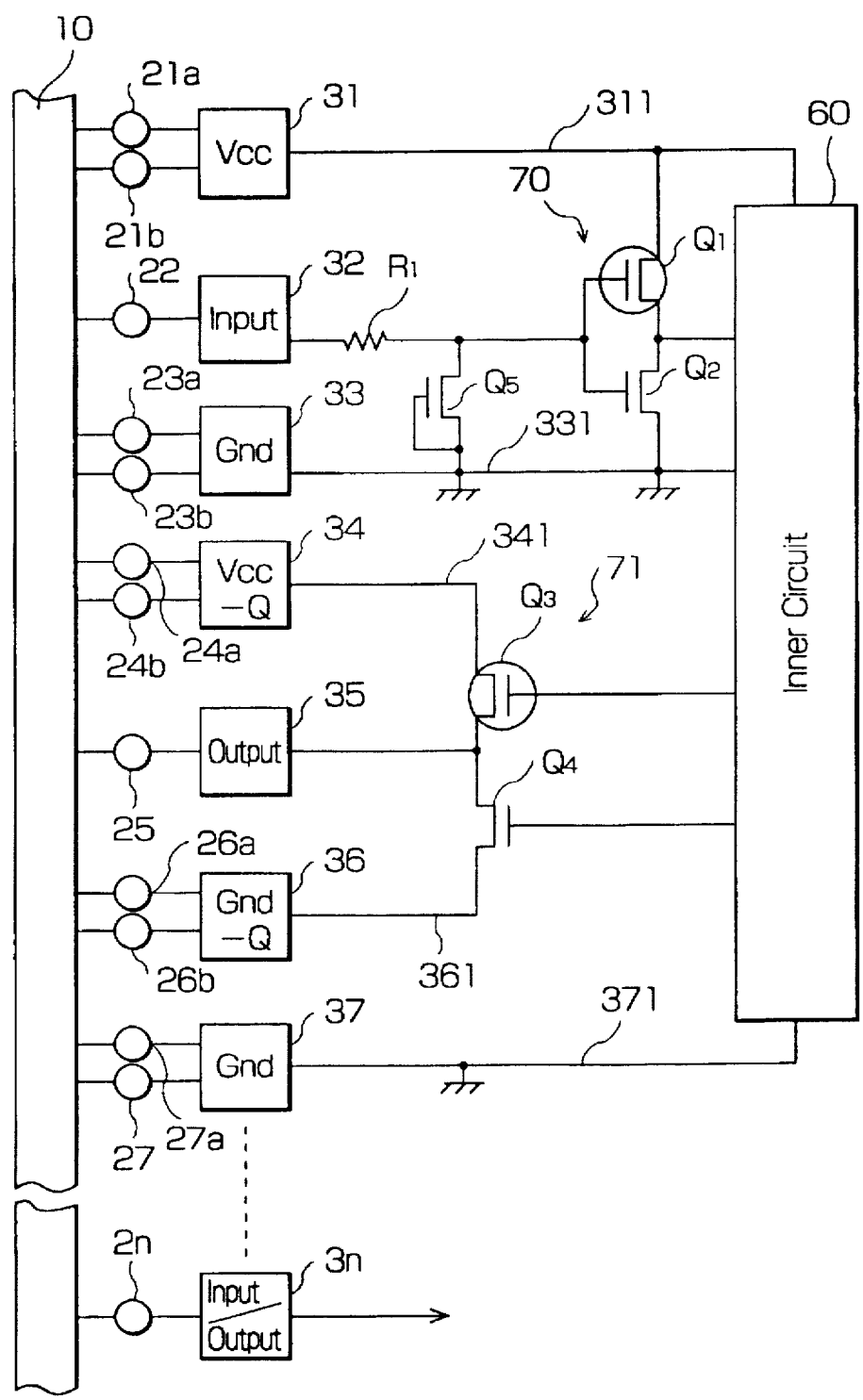
FIG. 5 is a circuit diagram of a semiconductor device according to an embodiment of the present invention.

FIG. 5 shows a semiconductor device having a protective circuitry according to an embodiment of the present invention. The semiconductor device has an inner circuit 60, a terminal group 31 to 3n including a plurality of input/output terminals 32, 35 and 3n, a first set of power terminals including Vcc and ground terminals 31 and 33 disposed for the plurality of input buffers 70 and the inner circuit 60, a second set of power terminals including VCC-Q and ground-Q terminals 34 and 36 disposed for the plurality of output buffers 71, a protective circuitry including protective elements and a common discharge line 10.

In the drawing, only one input terminal 32 and output terminal 35 and associated input/output buffers 70 and 71 are explicitly shown. However, it should be noted that a large number of input terminals 32 and output terminals 35 are provided for the inner circuit 60. Terminal 3n shown at the bottom of the drawing represents an input terminal or output terminal other than input terminal 32 or output terminal 35 shown in the drawing.

In the protective circuitry, a single protective element 22 or 25 is disposed for each of input terminals 32 or output terminals 35 which has a small parasitic capacitance between the same and the ground, while two protective elements, for example 21a and 21b, each having a configuration similar to that of the single protective element for the input/output terminal are disposed for each of Vcc terminal 31, ground terminal 33, Vcc-Q terminal 34, ground-Q terminal 36 and ground terminal 37, all of which have large parasitic capacitances between the same and the ground. The number of the "two" protective elements shown in the drawing are only an example, and any number of the elements or only even a single protective element having a large width current path (large channel width) can be provided instead of the two protective elements. By the configuration as described above, each of input/output terminals having a small parasitic capacitance is provided with a protective device having a resistance R while each of power terminals and ground terminals having a large parasitic capacitance is provided with a protective device having a resistance (½)*R.

Figure 3:
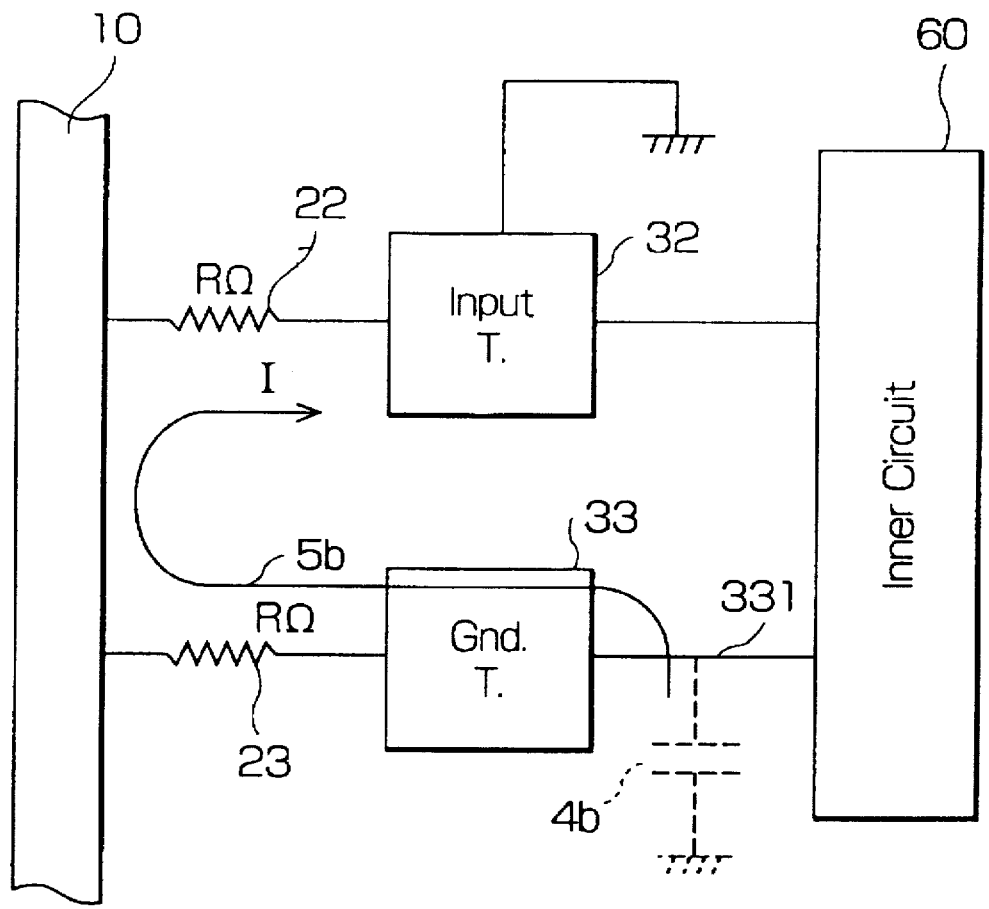
FIG. 3 is a circuit diagram equivalent to FIG. 2 after neglecting small currents.
Figure 6:
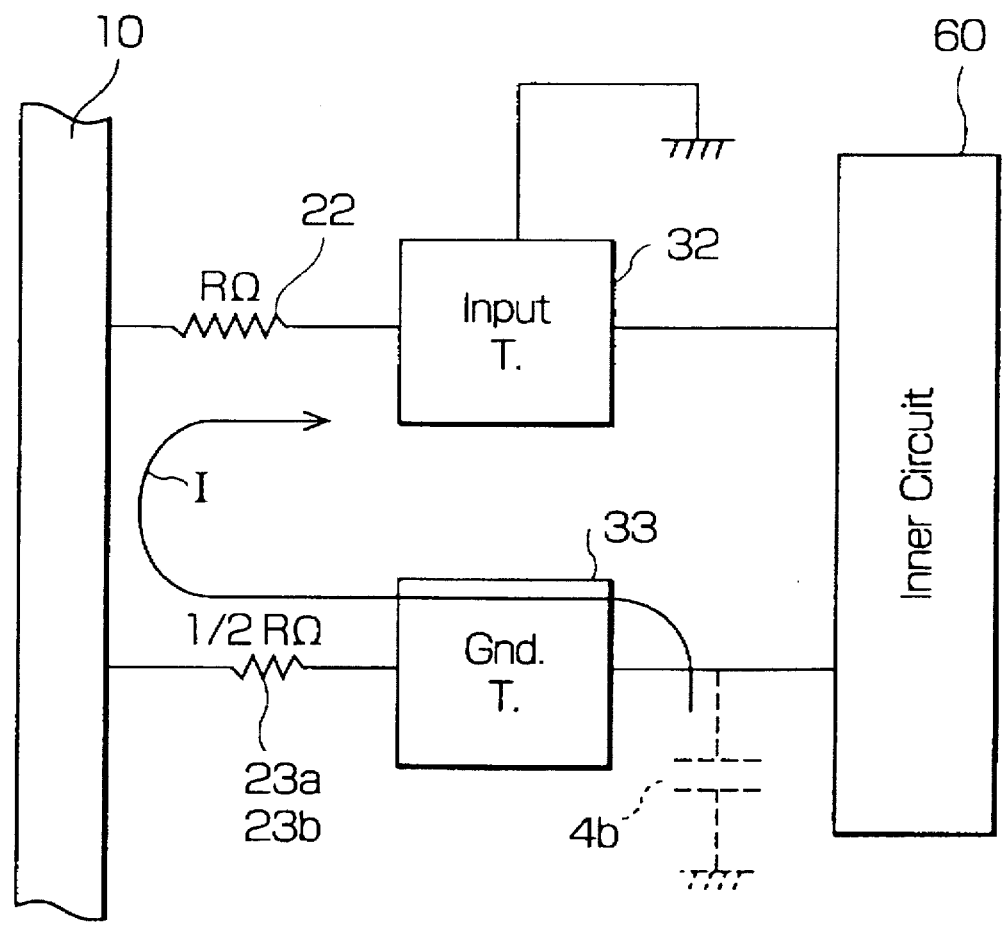
FIG. 6 is a partial circuit diagram of FIG. 5 during a CDM test after neglecting small currents.

FIG. 6 shows a partial circuit diagram of the semiconductor device shown in FIG. 5 during a CDM test procedure, in which small currents are neglected similarly to FIG. 3. When a selected input terminal 32 is grounded in the CDM test after charging of the semiconductor device as a whole, the voltage generated between input terminal 32 and ground terminal 33 is estimated at $$I \times (½)*R,$$

which is lower than the voltage generated in the conventional semiconductor device of FIG. 1, in which the corresponding voltage is estimated at I×2R. In this manner the induced voltage can be reduced by ¼ times in the embodiment.

Although each of Vcc terminals and ground terminals is provided with a protective device having a large width current path, the number of Vcc terminals and ground terminals is extremely low as compared to the number of the input/output terminals. Accordingly, most of the terminals still have protective devices having a small width current path. Namely, the configuration of the embodiment provides only a limited increase of the chip area even if a large width current path is provided for each of the protective devices for Vcc terminals and ground terminals.

Figure 7A:
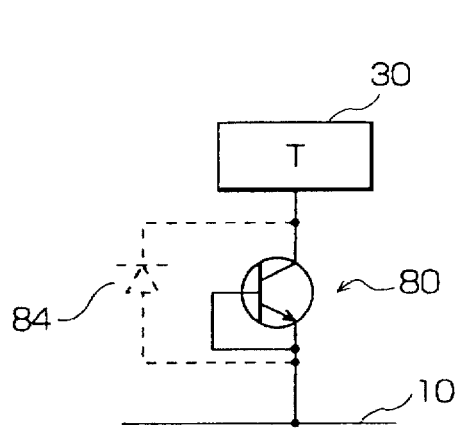
Figure 7B:
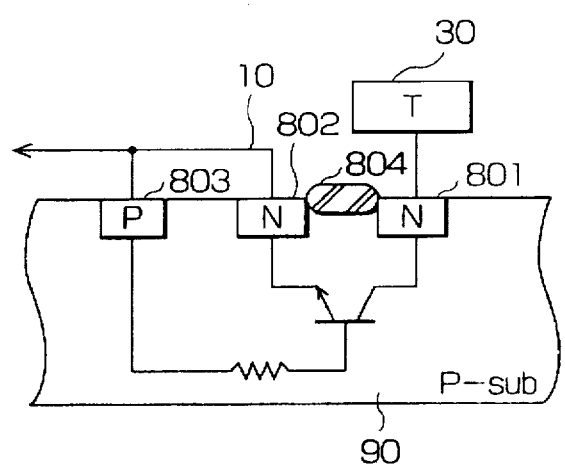
FIG. 7B is a cross-sectional view of the protective device of FIG. 7A.
Figure 8A:
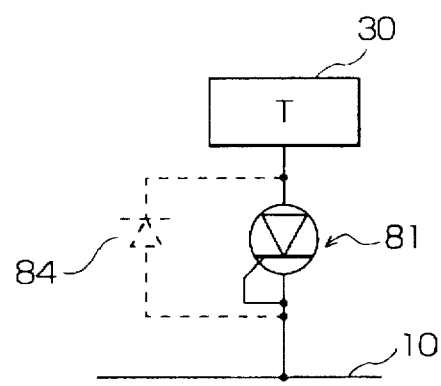
Figure 8B:
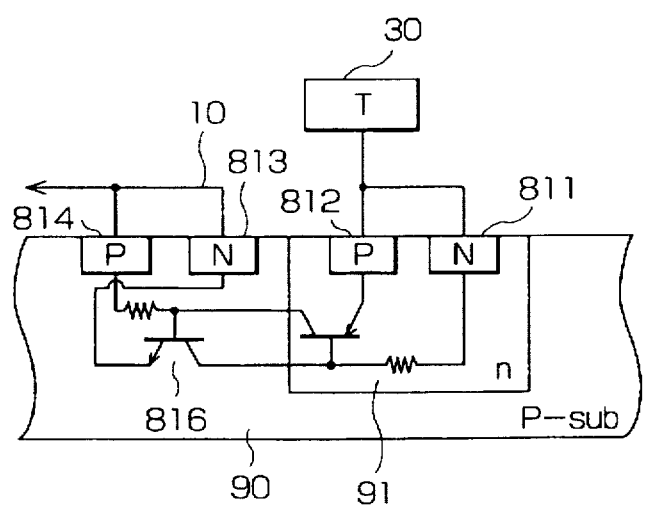
FIG. 8B is a cross-sectional view of the protective device of FIG. 8A.
Figure 9A:
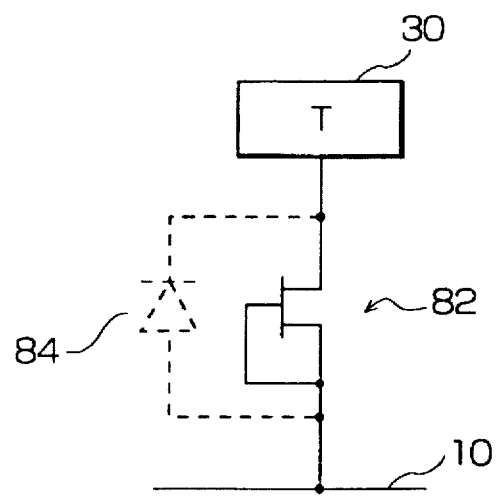
Figure 9B:
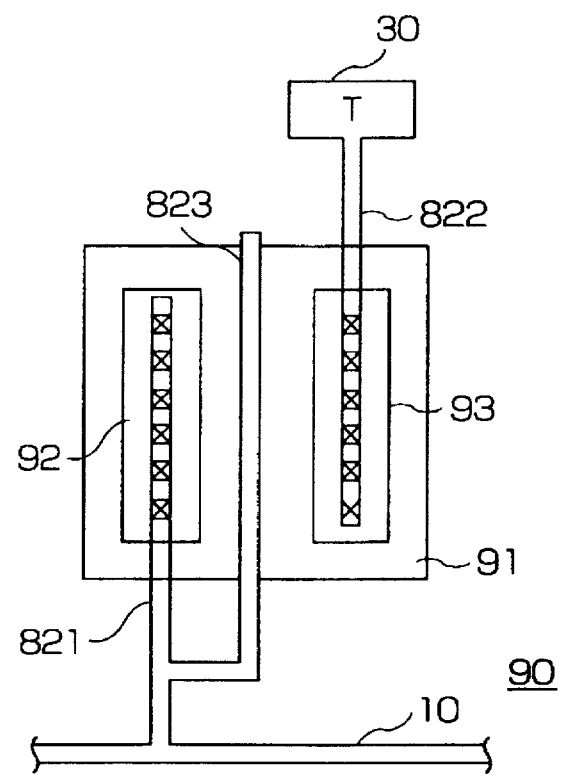
FIG. 9B is a top plan view of the protective device of FIG. 9A.

FIGS. 7A, 8A and 9A show the circuit diagram of the protective elements in FIG. 5 while FIGS. 7B, 8B and 9B show the structure of the protective elements of FIGS. 7A, 8A and 9A, respectively. The protective elements or element in each of the protective devices can be any of bipolar transistor 80, thyristor 81, NMOS FET 82 etc.

In FIG. 7A, NPN bipolar transistor 80 is provided between terminal 30 and common discharge line 10 with the base and emitter thereof being coupled to common discharge line 10. The dotted line shows a diode 84 which may be provided in parallel to the NPN transistor 80. In FIG. 7B, NPN transistor 80 is implemented by an n-collector region 801 connected to terminal 30, an n-emitter region 802 and a p-base region 803 both connected together to common discharge line 10, those regions 801, 802 and 803 being formed on the main surface of a p-substrate 90. The two n-regions 801 and 802 are separated by a field oxide film 804 to effect the p-region 803 as acting the base of the transistor.

In FIG. 8A, thyristor 81 is provided between terminal 30 and the common discharge line 10, with the anode and cathode thereof being coupled to terminal 30 and common discharge line 10, respectively. A diode 84 may be provided in parallel to the thyristor 81 in a reverse direction thereto. In FIG. 8B, a first n-region 811, a first p-region 812, a second n-region 813 and a second p-region 814 are juxtaposed on the main surface of a p-substrate 90 to form a p-n-p-n junction structure, first p- and n-regions 811 and 812 being connected to terminal 30 and disposed within an n-well 91 formed on the main surface, second p- and n-regions 814 and 815 being connected to common discharge line 10.

In FIG. 9A, NMOS FET 82 is provided between terminal 30 and common discharge line 10, with the gate and source electrodes thereof being connected to common discharge line 10. A diode 84 may be provided in parallel to the NMOS FET 82. In FIG. 9B, elongate p-diffused region 92 and 93 are disposed opposite to each other within an n-diffused region 91 formed on a p-substrate 90. The elongate source electrode 821 and drain electrode 822 contact p-diffused regions 92 and 93, respectively, with the elongate gate electrode 823 being interposed therebetween. The gate and source electrodes 821 and 823 of the NMOS FET 82 are connected to common discharge line 10 while the drain electrode 822 thereof is connected to terminal 30.

By the configuration of the embodiment as described above, when an input terminal is grounded after charging of the semiconductor device during a CDM test procedure, a metal line for the inner circuit or corresponding input buffer is effectively maintained below a predetermined potential, with a limited increase of the chip area. The present invention solves the trade-off relationship between the effective protective function and a reduced chip area of the semiconductor device.

Since the above embodiment is described only as an example, the present invention is not limited to such an embodiment and it will be obvious for those skilled in the art that various modifications over alterations can be easily made based on the above embodiment within the scope of the present invention.

What is claimed is:

1. A semiconductor device, comprising:
    a substrate;
    an inner circuit formed on said substrate;
    an external terminal group disposed for said inner circuit and including a plurality of first terminals and a plurality of second terminals; and
    a protective circuitry including:
        a common discharge line;
        a first protective device connected between each of said first terminals and said common discharge line; and
        a second protective device connected between each of said second terminals and said common discharge line, each of said first terminals having a first parasitic capacitance, each of said second terminals having a second parasitic capacitance larger than said first parasitic capacitance,
    said first protective device having a first on-resistance, said second protective device having a second on-resistance smaller than said first on-resistance.

2. A semiconductor device as defined in claim 1 wherein said first terminals include a plurality of input/output terminals and said second terminals include at least one of power terminals and ground terminals.

3. A semiconductor device as defined in claim 1 wherein said second protective device includes a plurality of protective elements each having a current path substantially equal to a current path of said first protective device in width.

4. A semiconductor device according to claim 1, wherein said second protective device has an on-resistance no more than ½ as much as the on-resistance of said first protective device.

5. A semiconductor device as defined in claim 1 wherein each of said first and second protective devices includes a clamp element.

6. A semiconductor device as defined in claim 5 wherein said clamp element comprises a bipolar transistor.

7. A semiconductor device as defined in claim 5 wherein said clamp element comprises a thyristor.

8. A semiconductor device as defined in claim 5 wherein said clamp element comprises a NMOS FET.

9. A semiconductor device as defined in claim 5 wherein each of said first and second protective devices further includes a diode connected in parallel to said clamp element.

10. A protective circuitry for a semiconductor device including a substrate, an inner circuit formed on said substrate, an external terminal group disposed for said inner circuit and including a plurality of first terminals and a plurality of second terminals, said protective circuitry comprising:

a common discharge line;

a first protective device connected between each of said first terminals and said common discharge line; and a second protective device connected between each of said second terminals and said common discharge line, each of said first terminals having a first parasitic capacitance, each of said second terminals having a second parasitic capacitance larger than said first parasitic capacitance, said first protective device having a first on-resistance, said second protective device having a second on-resistance smaller than said first on-resistance.

11. A protective circuitry according to claim 10, wherein said first terminals include a plurality of input/output terminals and said second terminals include at least one of power terminals and ground terminals.

12. A protective circuitry according to claim 10, wherein said second protective device includes a plurality of protective elements each having a current path substantially equal to a current path of said first protective device in width.

13. A protective circuitry according to claim 10, wherein said second protective device has an on-resistance no more than ½ as much as the on-resistance of said first protective device.

14. A protective circuitry according to claim 10, wherein each of said first and second protective devices includes a clamp element.

15. A protective circuitry according to claim 14, wherein said clamp element comprises a bipolar transistor.

16. A protective circuitry according to claim 14, wherein said clamp element comprises a thyristor.

17. A protective circuitry according to claim 14, wherein said clamp element comprises a NMOS FET.

18. A protective circuitry according to claim 14, wherein each of said first and second protective devices further includes a diode connected in parallel to said clamp element.

* * * * *